United States Patent
Takeda

(10) Patent No.: US 12,087,800 B2
(45) Date of Patent: Sep. 10, 2024

(54) PHOTODECTOR INCLUDING GERMANIUM LAYER AND DOPED REGION

(71) Applicant: Nippon Telegraph and Telephone Corporation, Tokyo (JP)

(72) Inventor: Kotaro Takeda, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 595 days.

(21) Appl. No.: 17/420,644

(22) PCT Filed: Jan. 14, 2020

(86) PCT No.: PCT/JP2020/000917
§ 371 (c)(1),
(2) Date: Jul. 2, 2021

(87) PCT Pub. No.: WO2020/149266
PCT Pub. Date: Jul. 23, 2020

(65) Prior Publication Data
US 2022/0077219 A1    Mar. 10, 2022

(30) Foreign Application Priority Data
Jan. 16, 2019   (JP) .................................. 2019-005535

(51) Int. Cl.
*H01L 31/02* (2006.01)
*G01J 1/42* (2006.01)
(Continued)

(52) U.S. Cl.
CPC .......... *H01L 27/14643* (2013.01); *G01J 1/42* (2013.01); *H01L 31/0232* (2013.01);
(Continued)

(58) Field of Classification Search
CPC ............ H01L 27/14643; H01L 27/1446; H01L 31/0232; H01L 31/028; H01L 31/035281;
(Continued)

(56) References Cited

U.S. PATENT DOCUMENTS 9,755,096 B2 *  9/2017  Novack ............... H01L 31/1804
9,871,153 B2 *  1/2018  Novack ................... H01L 27/14
(Continued)

FOREIGN PATENT DOCUMENTS

JP       2000-221455 A     8/2000
JP       2006-245344 A     9/2006
(Continued)

OTHER PUBLICATIONS

G. G. Macfarlane et al., *Fine Structure in the Absorption-Edge Spectrum of Ge*, Physical Review, vol. 108, No. 6, 1957, pp. 1377-1383.

*Primary Examiner* — Ida M Soward
(74) *Attorney, Agent, or Firm* — Workman Nydegger

(57) ABSTRACT

A problem to be solved is to make plural Ge PDs uniform in sensitivity by heating based on the Ge PDs with heaters photocurrent measurements taken by a current monitor, and thereby curb deterioration in a common-mode rejection ratio. A photodetector according to the present invention is a germanium photodetector (Ge PD) that uses germanium or a germanium compound in a light absorption layer, the photodetector including two or more Ge PDs placed to receive an input differential signal; a current monitor adapted to measure photocurrents of the two or more Ge PDs; resistors adapted to heat the respective Ge PDs; voltage sources connected to the respective resistors and capable of controlling voltage values independently of each other, wherein the voltage sources are connected with the current monitor, and the voltage sources manipulate voltages
(Continued)

applied to the heaters such that current values output by the two or more Ge PDs will match each other.

14 Claims, 13 Drawing Sheets

(51) Int. Cl.
    *H01L 27/146*     (2006.01)
    *H01L 31/0232*     (2014.01)
    *H01L 31/028*     (2006.01)
    *H01L 31/024*     (2014.01)

(52) U.S. Cl.
    CPC ...... *H01L 31/028* (2013.01); *H01L 31/02016* (2013.01); *H01L 31/024* (2013.01)

(58) Field of Classification Search
    CPC .... H01L 31/105; H01L 31/02016; G01J 1/42; G01J 1/1626
    See application file for complete search history.

(56) References Cited

U.S. PATENT DOCUMENTS

| | | | |
|---|---|---|---|
| 2003/0189160 A1* | 10/2003 | Sakurai | H04N 25/772 348/E9.01 |
| 2006/0198416 A1 | 9/2006 | Yamazaki | |
| 2011/0024608 A1* | 2/2011 | Assefa | H01L 31/022408 257/438 |
| 2012/0286144 A1* | 11/2012 | Holz | G01J 1/42 257/439 |
| 2014/0159128 A1* | 6/2014 | Lee | H01L 31/09 257/432 |
| 2018/0247968 A1* | 8/2018 | Na | H01L 29/161 |

FOREIGN PATENT DOCUMENTS

| | | | |
|---|---|---|---|
| JP | 2018-74104 A | | 5/2018 |
| JP | 2018074104 A | * | 5/2018 |
| JP | 2018181918 A | * | 11/2018 |

* cited by examiner

PHOTODECTOR INCLUDING GERMANIUM LAYER AND DOPED REGION

TECHNICAL FIELD

The present invention relates to a photodetector used in an optical communications system and an optical information processing system, and more particularly, to a structure used to provide a photodetector having a small common-mode rejection ratio in receiving a differential signal.

BACKGROUND ART

With the recent spread of optical communications, there has been demand for cost reduction of optical communications devices.

One of solutions to this is a method that forms an optical circuit of an optical communications device on a large-diameter wafer such as a silicon wafer using a microoptical circuit technique such as silicon photonics. This dramatically reduces material costs per chip, making it possible to reduce the costs of optical communications devices.

A typical photodetector formed on a silicon (Si) substrate that uses such a technique is a germanium photodetector (Ge PD) that lends itself to monolithic integration. FIG. 1 is a diagram schematically showing a structure of a conventional waveguide-coupled vertical Ge PD. FIG. 2 is a sectional view taken along line II-II in FIG. 1. Note that in FIG. 1, to make it easier to understand the structure, an upper clad layer 103 and electrodes 116 to 118 shown in FIG. 2 are omitted and that the electrodes 116 to 118 are indicated by rectangles only at positions where the electrodes 116 to 118 are put in contact with silicon electrode units 112 and 113 implanted with first impurities and a Ge region 115 implanted with second impurities.

The Ge PD is formed on an SOI (Silicon On Insulator) substrate that includes a Si substrate, a Si oxide film, and a surface Si layer, using lithography technology or the like. The Ge PD 100 shown in FIG. 2 includes a Si substrate 101, a lower clad layer 102 including a Si oxide film on the Si substrate, a core layer 110 configured to introduce signal light, a Ge layer 114 formed on the core layer 110 and configured to absorb light, and an upper clad layer 103 formed on the core layer 110 and the Ge layer 114.

As can be seen from FIG. 1, the core layer 110 is divided into a waveguide layer 1101 and a silicon slab 1102.

A Si slab 111 implanted with the first impurities as well as silicon electrode units 112 and 113 doped with a high concentration of the first impurities and configured to act as electrodes are formed on the silicon slab 1102. The Ge layer 114 is laminated by epitaxial growth and the Ge region 115 doped with second impurities is formed on top of the layer 114. The Ge layer 114 may contain a germanium compound. The electrodes 116 to 118 are provided on the silicon electrode units 112 and 113 and the Ge region 115 by being placed in contact with them.

When light entering the silicon slab 1102 through the waveguide layer 1101 is absorbed by the Ge layer 114, photocurrents flow between the electrode 117 and the electrode 116 as well as between the electrode 117 and the electrode 118, and the Ge PD detects the light by detecting the photocurrents.

Besides the Ge PD shown in FIGS. 1 and 2, there are also horizontal Ge PDs such as shown in FIGS. 3 and 4. The horizontal Ge PD of FIG. 3 includes a germanium region 121 implanted with the first impurities and a germanium region 122 implanted with the second impurities instead of including the p-type Si slab 111 implanted with the first impurities and the Ge region 115 doped with the second impurities. The horizontal Ge PD of FIG. 4 includes a silicon region 131 implanted with the first impurities, a silicon region 132 implanted with the second impurities, and a silicon electrode unit 113 doped with a high concentration of the second impurities and configured to act as an electrode instead of including the p-type Si slab 111 implanted with the first impurities and the Ge region 115 doped with the second impurities. The Ge layer 114 may contain a germanium compound instead of germanium. A region 123 is free of first impurities and second impurities.

The Ge PD 100 shown in FIGS. 2, 3, and 4 has the property that temperature characteristics of sensitivity (characteristics of current output in response to optical input power; unit is A/W) is not constant. FIG. 5 is a diagram plotting sensitivity against Ge PD communications wavelength in the C-band and L-band (wavelength ranges of 1530 to 1565 nm and 1565 to 1625 nm) at a reverse bias of 1.6 V at different temperatures. For example, at 31 degrees C., almost constant sensitivity is exhibited up to the neighborhood of C-band, but the sensitivity decreases in the L-band. The sensitivity change is caused by changes in the optical absorption spectrum of germanium. At −5 degrees C., there is a tendency for the sensitivity to decrease even in the C-band. FIG. 6 shows temperature dependence of the optical absorption spectrum of germanium (Non-Patent Literature 1), where the abscissa and the ordinate represent photon energy and the square root of an absorption coefficient k, respectively. When the temperature lowers, a band gap of germanium shifts to a high energy side. That is, an end of the optical absorption spectrum shifts to a short wavelength side. The end of the optical absorption spectrum of germanium used for the Ge PD is just around 1565 nm on the long wavelength side of the C-band at 31 degrees C. Therefore, at 31 degrees C., even though the Ge PD exhibits constant sensitivity over the entire C-band, the sensitivity decreases gradually with decreases in the temperature, starting from the long wavelength side. This tendency is shown in FIG. 5, in which at a low temperature of −5 degrees C., the sensitivity tends to decrease with increases in wavelength.

If one attempts to incorporate a Ge PD whose sensitivity varies with the temperature and wavelength into an optical communications system, a circuit for use to compensate for the sensitivity variation becomes necessary, increasing production cost.

Therefore, as a means of solving temperature dependence, there is a means to stabilize temperature around a device by installing a heater (Patent Literatures 1, 2, and 3).

On the other hand, in a Ge-PD-based optical communications system or optical information processing system, it is less common to use the Ge PD alone, and generally two to eight Ge PDs are used by being placed side by side. When as many Ge PDs as there are wavelengths are needed in a system adopting wavelength-division multiplexing (WDM) that uses multiple wavelengths or when balanced PDs are used in a system adopting optical digital coherent communications technology, plural PDs are needed. FIG. 7 shows an example of a configuration of a receiver used in the optical digital coherent communications technology. The configuration uses eight Ge PDs 704. In this case, if Ge PDs 704 equipped with a heater are used, eight heaters are needed. In particular, Ge PDs 704 connected to a same optical hybrid 703 operate in pairs to receive a differential signal and uniform sensitivity is required of the pair. Each of a local light source 701 and a polarization separator 702 are connected to two optical hybrids 703.

CITATION LIST

Patent Literature

Patent Literature 1: Japanese Patent Laid-Open No. 2000-221455
Patent Literature 2: Japanese Patent Laid-Open No. 2006-245344
Patent Literature 3: Japanese Patent Laid-Open No. 2018-74104

Non-Patent Literature

Non-Patent Literature 1: Macfarlane G. G., T. P. McLean, J. E. Quarrington and V. Roberts, Phys. Rev. 108, 6 (1957) 1377-1383.

SUMMARY OF THE INVENTION

Technical Problem

If not uniform in sensitivity, the Ge PDs that receive a differential signal will deteriorate in the common-mode rejection ratio, resulting in deterioration of receiver performance. However, because Ge PDs and heaters have manufacturing variations, there is a problem in that there is some variation in sensitivity between the Ge PDs, incurring a penalty in terms the common-mode rejection ratio.

The present invention has been made in view of the above problems and has an object to provide a Ge PD having uniform sensitivity in the C-band and L-band by the use of heaters and produce a receiver not subject to deterioration in the common-mode rejection ratio due to the sensitivity of the Ge PD.

Means for Solving the Problem

To achieve the above object, the present invention is characterized by having the following configuration. As shown in FIG. 8, a photodetector includes two or more photodiodes (Ge PD) 1001 and 1002 placed to receive an input differential signal; an ammeter 204 serving s a current monitor adapted to measure photocurrents of the two or more photodiodes; heaters 200 and 201, which are resistors adapted to heat the photodiodes 1001 and 1002; and voltage sources 202 and 203 connected to the respective resistors to control the resistors and capable of controlling voltage values independently of each other, wherein the voltage sources 202 and 203 are connected with the ammeter 204 serving as a current monitor, and the voltage sources 202 and 203 manipulate voltages applied to the heaters such that values of currents output by the two or more photodiodes 1001 and 1002, as measured by the current monitor, match each other. The Ge PD 1001 and the Ge PD 1002 are equipped with the heater 200 and the heater 201, respectively. The heater 200 and the heater 201 are controlled by a power supply (voltage source) 202 and a power supply (voltage source) 203, respectively, and the power supply (voltage source) 202 and the power supply (voltage source) 203 detect values on the ammeter 204 and determine the voltages to be applied to the heaters. A bias power supply is shown on a cathode side of the Ge PDs 1001 and 1002 and a signal output terminal (output port) 212 is shown on an anode side in the illustrated example, but the cathode side and the anode side may be reversed.

Effects of the Invention

The present invention can make plural Ge PDs uniform in sensitivity by heating the Ge PDs with heaters based on photocurrent measurements taken by the current monitor, and thereby curb deterioration in a common-mode rejection ratio.

DESCRIPTION OF EMBODIMENTS

Figure 1:
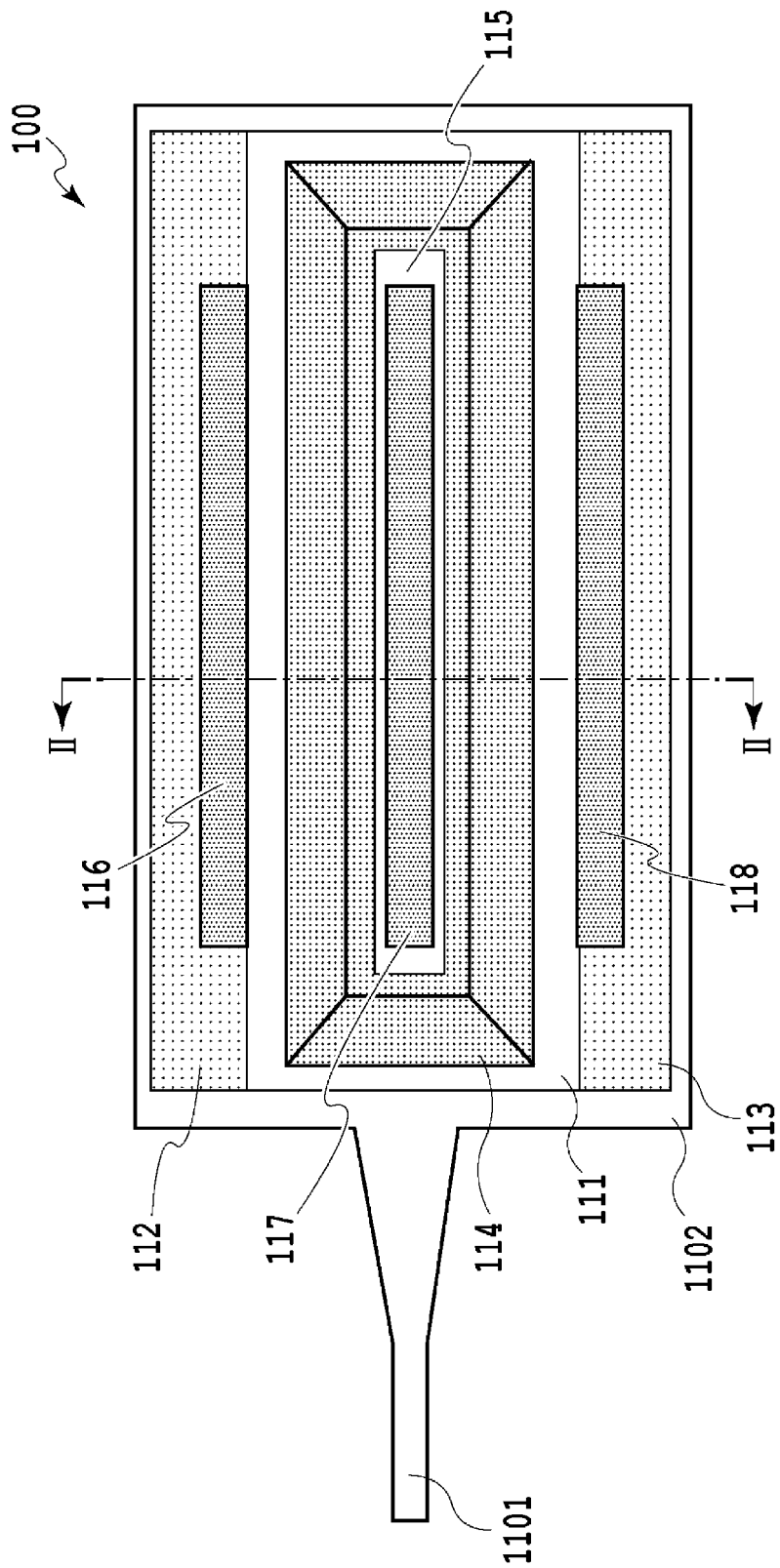
FIG. 1 is a diagram showing a typical vertical Ge PD.
Figure 2:
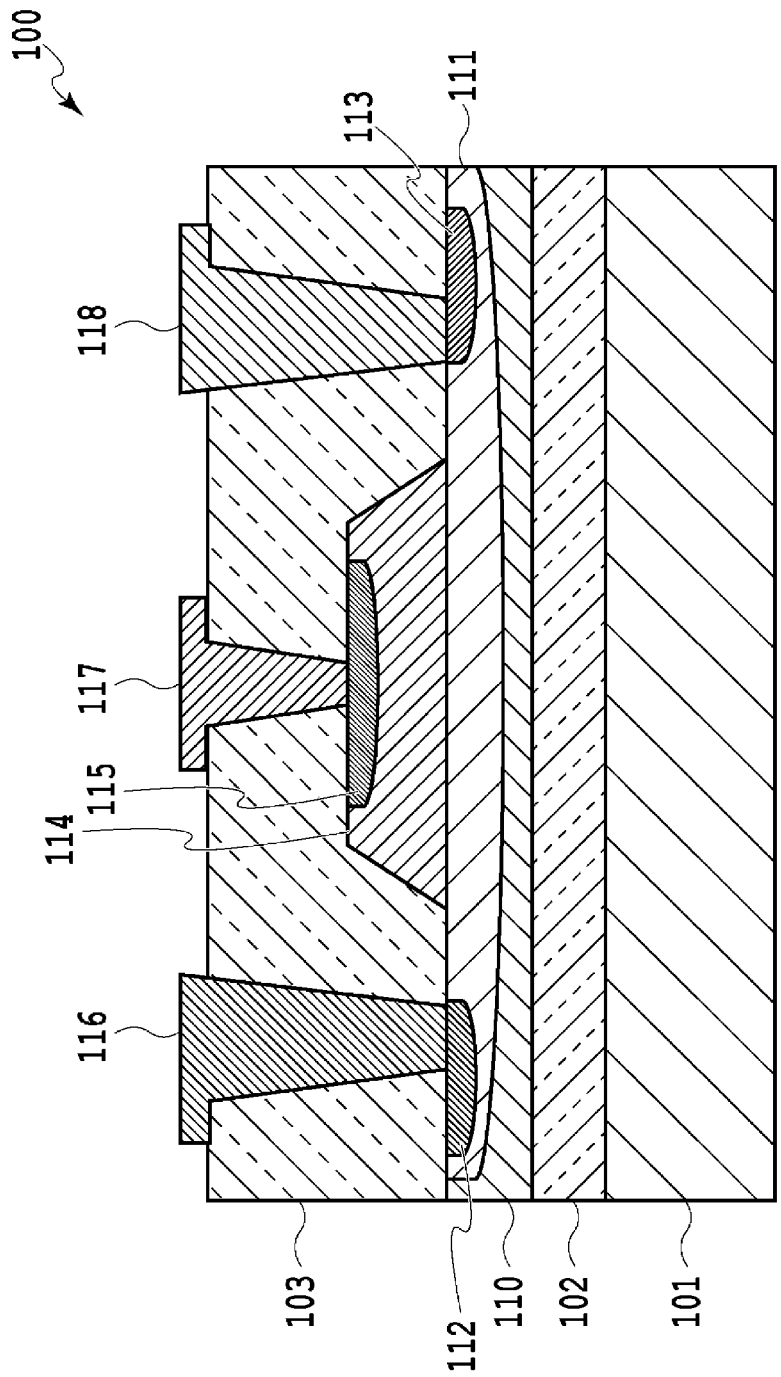
FIG. 2 is a diagram showing a sectional structure of the Ge PD of FIG. 1.
Figure 3:
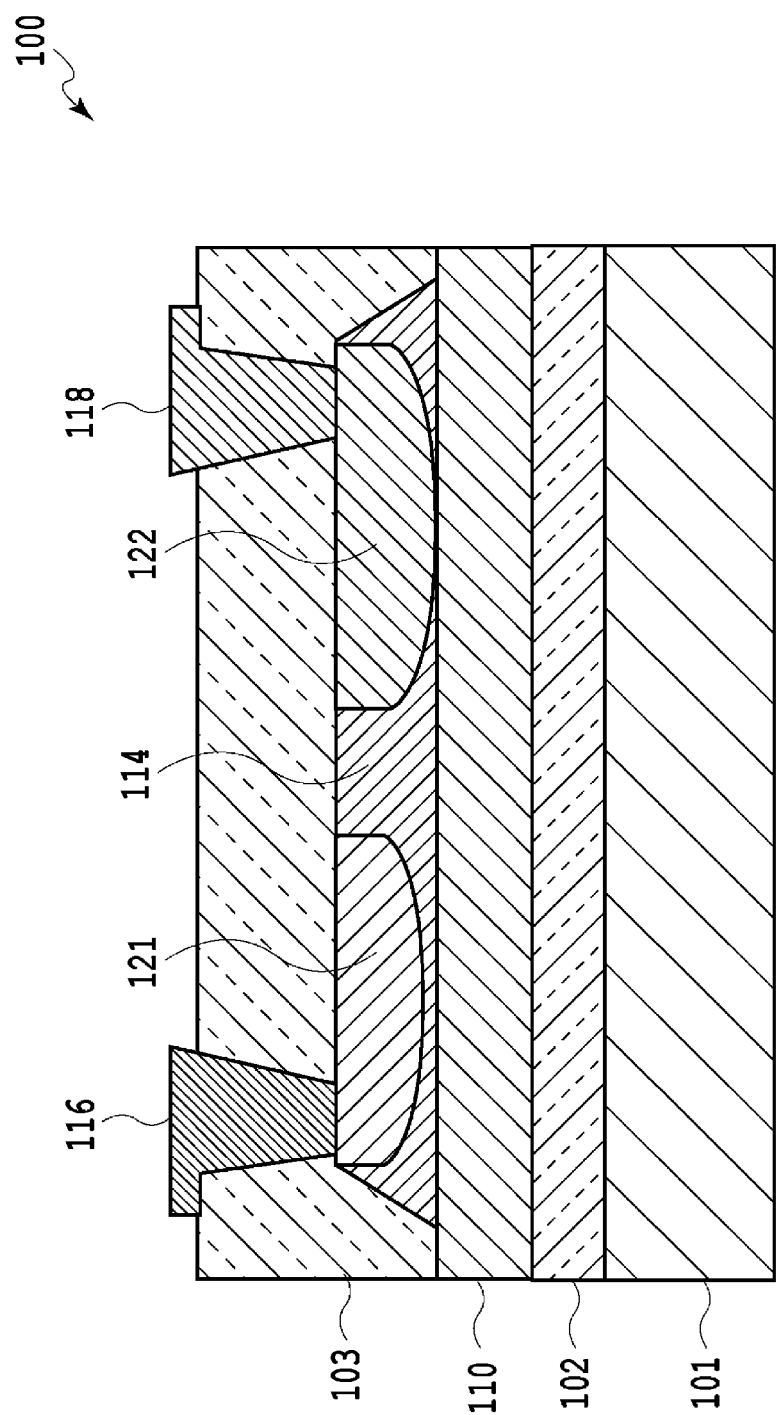
FIG. 3 is a diagram showing a typical horizontal Ge PD.
Figure 4:
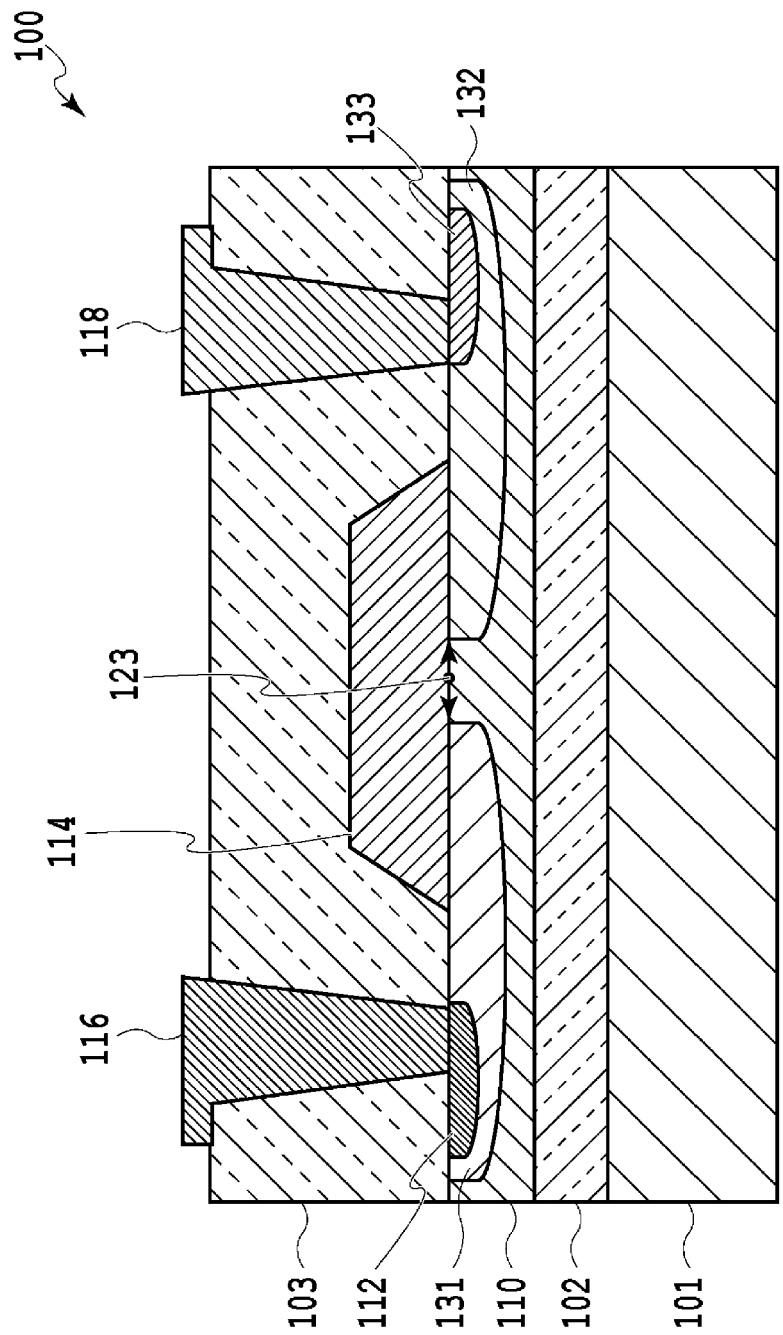
FIG. 4 is a diagram showing a typical horizontal Ge PD.

Forms of a photodetector according to the present invention will be described in detail below with reference to preferred embodiments and examples. Note that in the drawings, components having the same functions are denoted by the same reference numerals for clarity of explanation. However, the present invention is not limited to the description of the embodiments shown below, and it is apparent to those skilled in the art that various changes can be made to forms and details without departing from the spirit and scope of the invention disclosed herein and the like.

Figure 5:
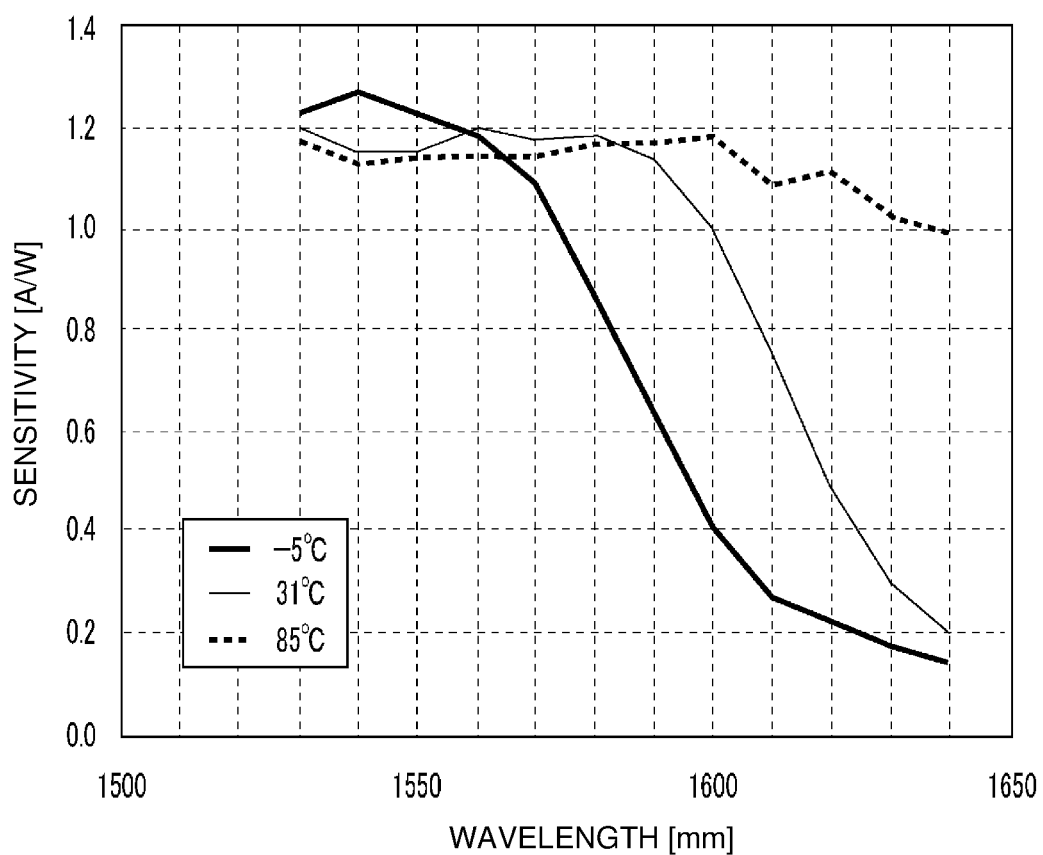
FIG. 5 is a diagram showing temperature- and wavelength-dependence characteristics of sensitivity of a Ge PD.
Figure 6:
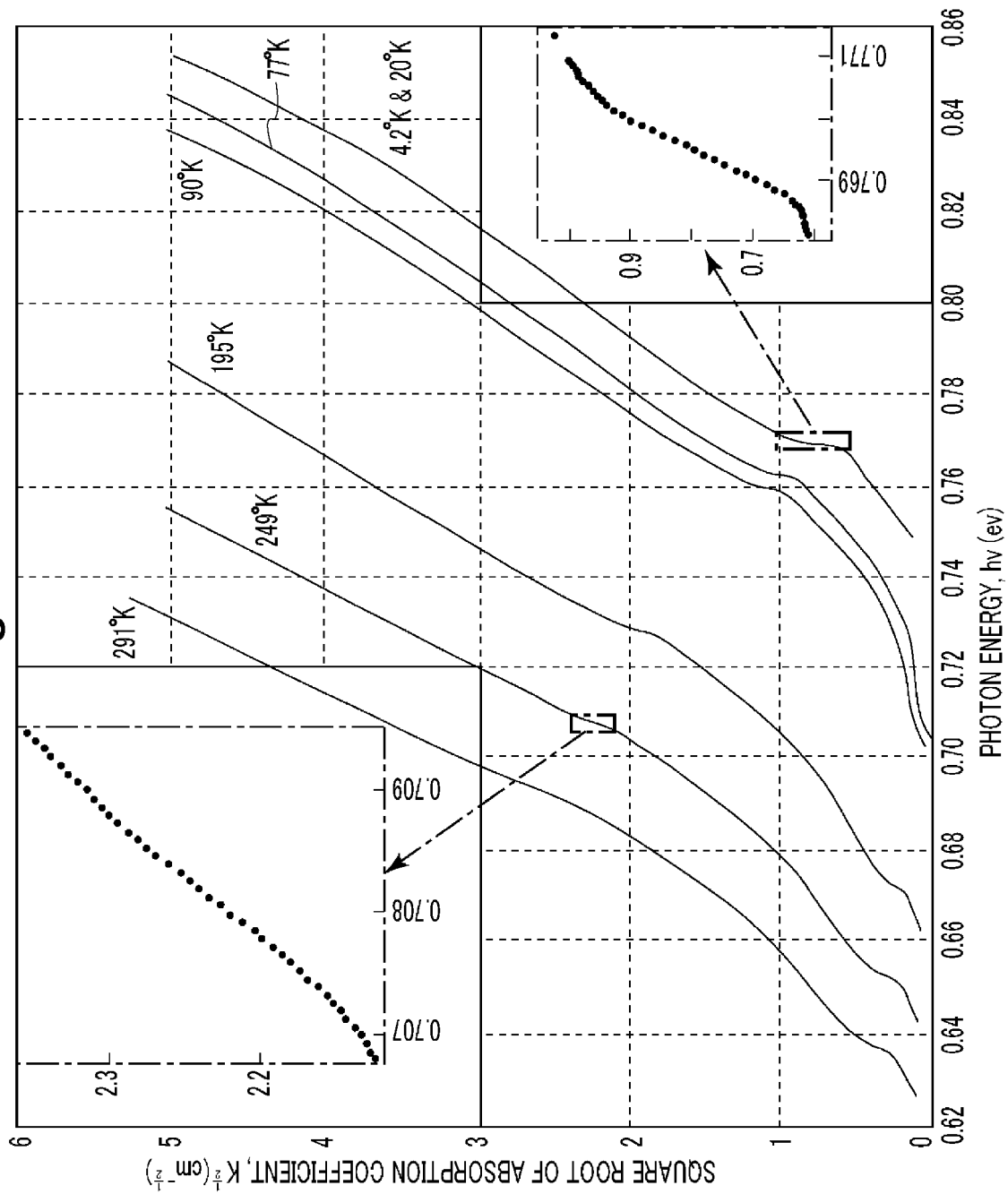
FIG. 6 is a diagram showing temperature-dependence characteristics of a light absorption spectrum of Ge.
Figure 7:
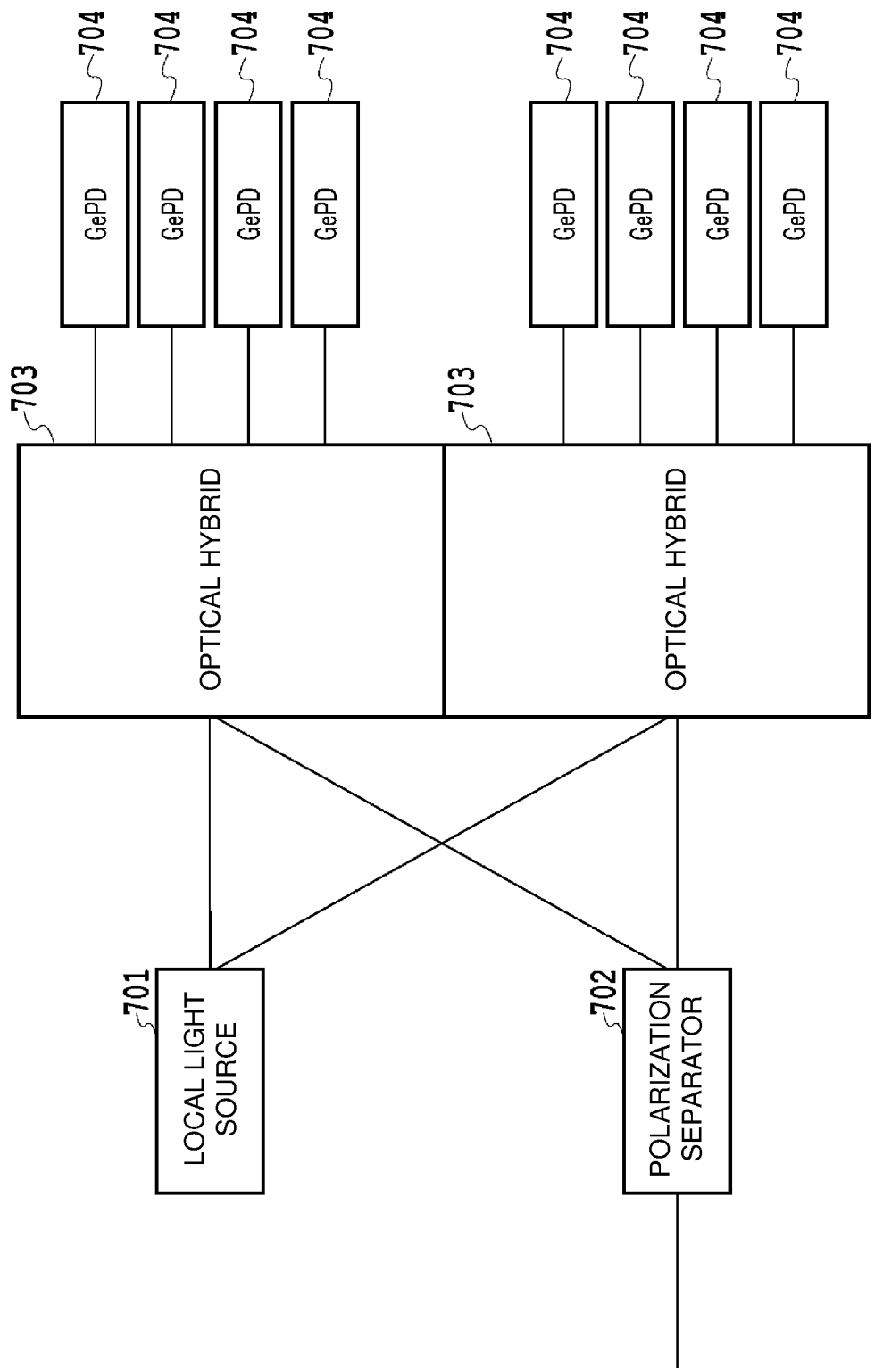
FIG. 7 is a diagram showing an example of a configuration of a receiver used in the optical digital coherent communications technology.
Figure 8:
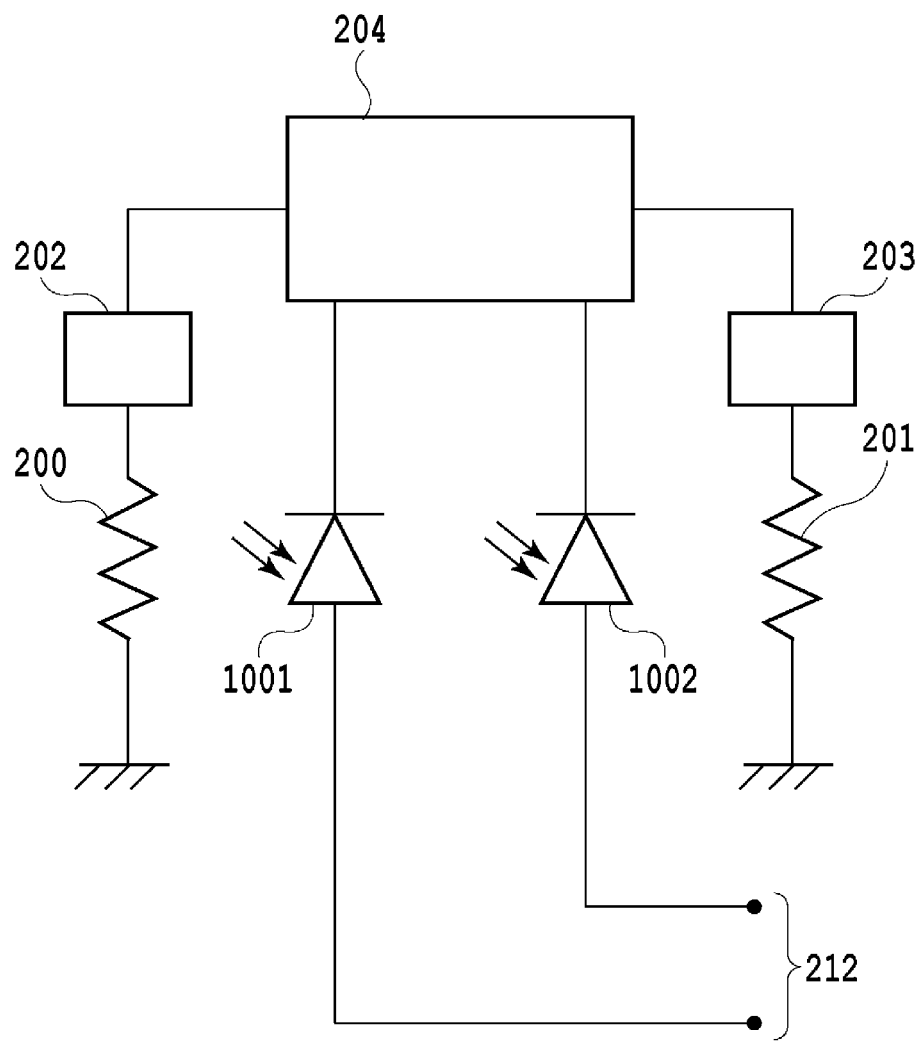
FIG. 8 is a diagram showing a configuration of a photoreceiver according to the present invention.

As shown in FIG. 8, a photodetector according to the present invention includes two or more photodiodes (Ge PDs) 1001 and 1002 placed to receive an input differential signal; an ammeter 204 serving as a current monitor adapted to measure photocurrents of the two or more photodiodes; heaters 200 and 201, which are resistors adapted to heat the photodiodes 1001 and 1002; and voltage sources 202 and 203 connected to the respective resistors to control the resistors and capable of controlling voltage values independently of each other, wherein the voltage sources 202 and 203 are connected with the ammeter 204 serving as a current monitor, and the voltage sources 202 and 203 manipulate voltages applied to the heaters such that values of currents output by the two or more photodiodes 1001 and 1002, as measured by the current monitor, will match each other. A concrete drive method will be described below. The ammeter 204 serving as a monitor measures currents from the Ge PDs 1001 and 1002. The monitor adjusts voltages applied to the heater 200 and heater 201, such that the measured currents of the Ge PDs will be equal to each other. The Ge PD 1001 and Ge PD 1002 are heated by the heaters and thereby change sensitivity. As can be seen from FIG. 5, since the sensitivity of the Ge PDs depends on temperature, the heaters can make plural Ge PDs uniform in sensitivity by heating. The currents measured by the ammeter 204 serving as a monitor are photocurrents, and when the values of the photocurrents match each other, it can be said that the Ge PDs 1001 and 1002 exactly match each other in sensitivity. Viewed from another angle, deterioration in a common-mode rejection ratio cannot occur with the photodetector according to the present invention. Reference sign 212 linked to the Ge PDs 1001 and 1002 denotes signal output terminals. Although the ammeter 204 serving as a monitor is connected to cathodes of the Ge PDs in FIG. 8, the ammeter 204 may be connected to anodes. Also, although the signal output terminals 212 and the ammeter 204 serving as a monitor are connected to the anodes and the cathodes, respectively, both the signal output terminals 212 and the ammeter 204 serving as a monitor may be connected to either the anodes or cathodes.

Embodiment 1

Figure 9:
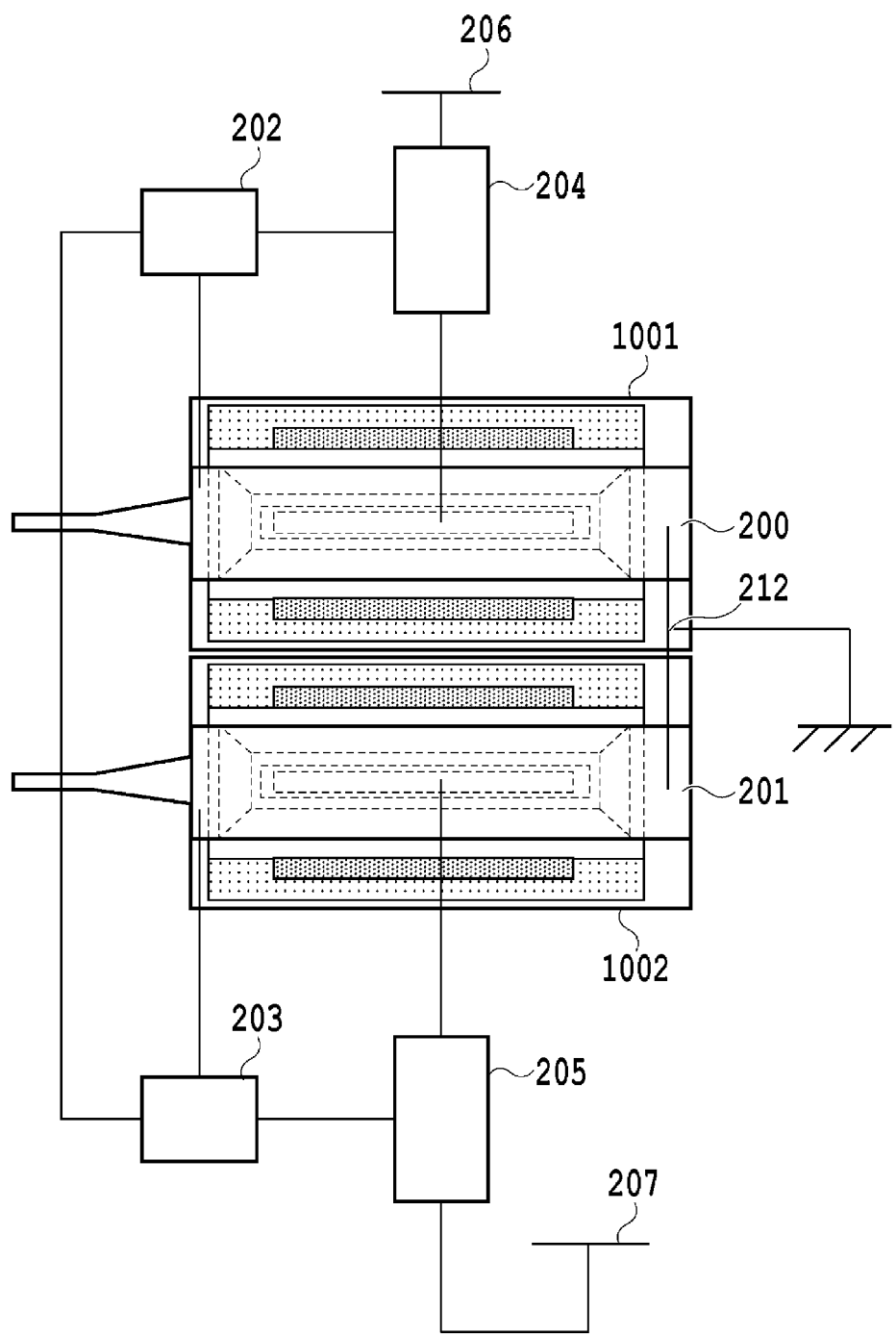
FIG. 9 is a diagram showing a configuration of a photodetector according to a first embodiment.
Figure 10:
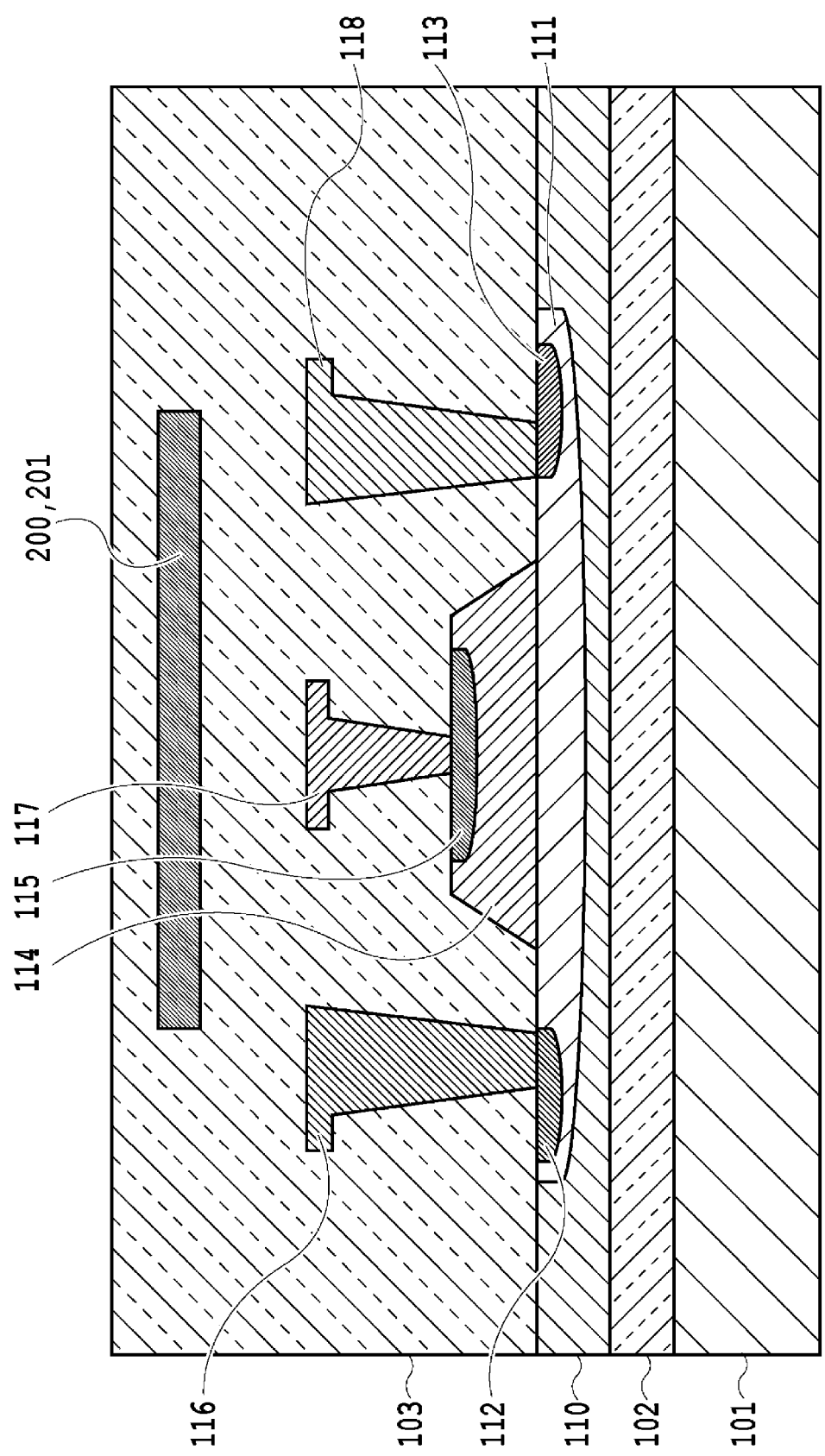
FIG. 10 is a diagram showing the configuration of the photodetector according to the first embodiment.

FIGS. 9 and 10 are a top view and a sectional view, respectively, showing a configuration of a first embodiment of the photodetector according to the present invention. In this example, ammeters connected to the cathodes of the Ge PDs 1001 and 1002 serve as monitors while the heaters 200 and 201 containing a metal or metal compound are placed as resistors. As shown in FIG. 9, a photodetector according to the present invention includes two or more photodiodes (Ge PDs) 1001 and 1002 placed to receive an input differential signal; ammeters 204 and 205 serving as current monitors adapted to measure photocurrents of the two or more photodiodes; heaters 200 and 201, which are resistors adapted to heat the photodiodes; and voltage sources 202 and 203 connected to the respective resistors to control the resistors and capable of controlling voltage values independently of each other. Here, the voltage source 202 is connected with the ammeter 204 serving as a current monitor, the voltage source 203 is connected with the current source 205 serving as a current monitor, the voltage source 202 and the voltage source 203 manipulate voltages applied to the heater 200 and the heater 201 such that values of currents output by the two or more photodiodes 1001 and 1002, as measured by the current monitors, will match each other. A concrete drive method will be described below. As shown in FIG. 10, the heaters 200 and 201 are embedded in the upper (over) clad layer 103. The Ge PDs 1001 and 1002 are placed as a PD pair to receive a differential signal. The heaters 200 and 201 are placed covering the germanium layers 114 of the respective Ge PDs. The ammeters 204 and 205 are attached to the cathodes of the respective Ge PDs, and voltage sources 206 and 207 are connected to the ammeters 204 and 205, respectively. The ammeters 204 and 205 are connected, respectively, with the voltage sources 202 and 203 for the respective heaters 200 and 201. The voltage sources 202 and 203 adjust the voltages applied to the heaters, such that the currents indicated by the ammeters 204 and 205 will be equal to each other. The photodiodes (Ge PDs) 1001 and 1002 are connected with the signal output terminals 212.

Embodiment 2

Figure 11:
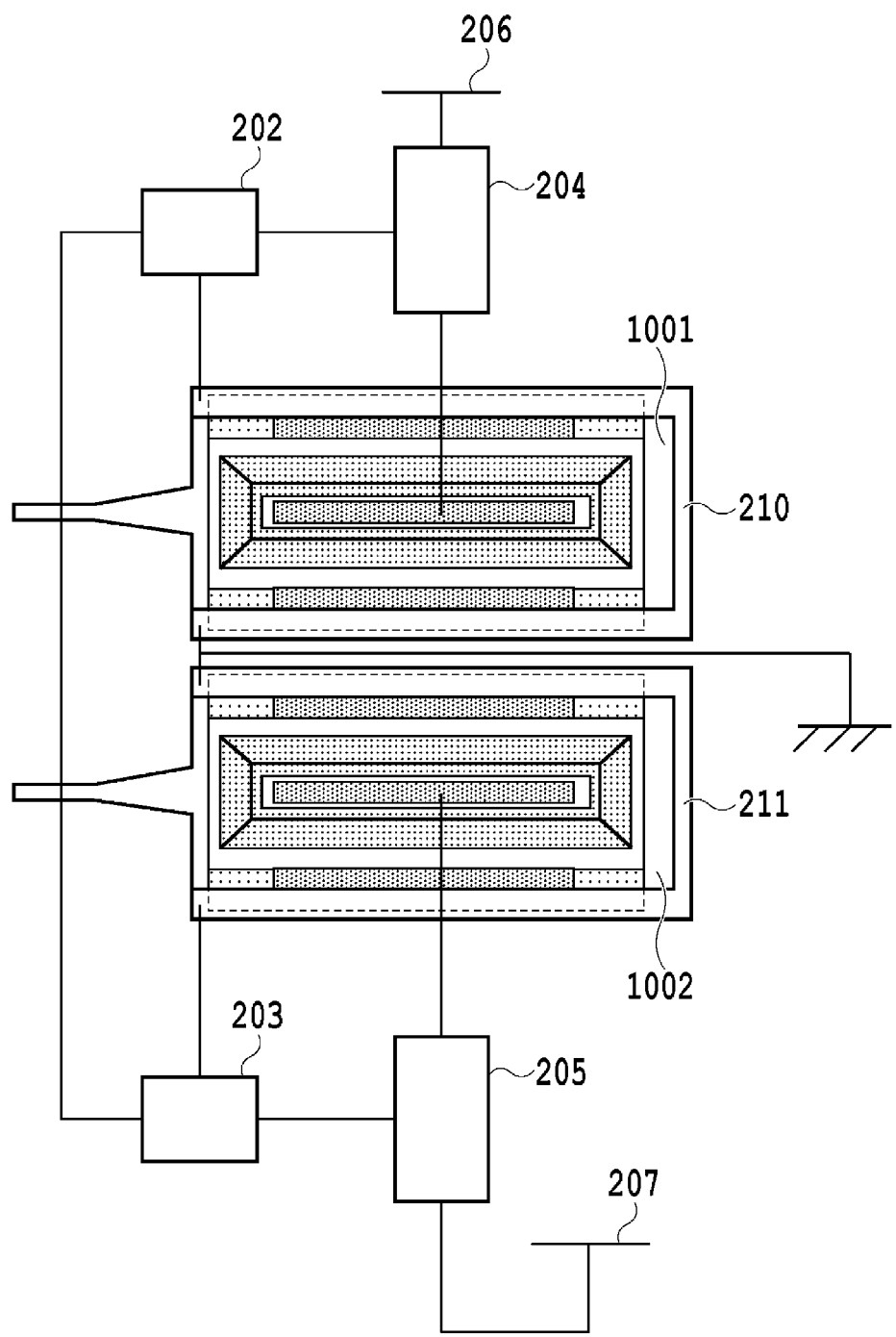
FIG. 11 is a diagram showing a configuration of a photodetector according to a second embodiment.

FIG. 11 is a diagram showing a configuration of a second embodiment of the photodetector according to the present invention. In this example, ammeters connected to the cathodes of the Ge PDs 1001 and 1002 serve as monitors while heaters 210 and 211 created by implantation (ion implantation) in the core layers 110 of the Ge PDs 1001 and 1002 are placed as resistors. The Ge PDs 1001 and 1002 are placed as a PD pair to receive a differential signal. The ammeters 204 and 205 are attached to the cathodes of the respective Ge PDs, and voltage sources 206 and 207 are connected to the ammeters 204 and 205, respectively. The ammeters 204 and 205 are connected, respectively, with the voltage sources 202 and 203 for the respective heaters 200 and 201. The voltage sources 202 and 203 adjust the voltages applied to the heaters, such that the currents indicated by the ammeters 204 and 205 will be equal to each other.

Embodiment 3

Figure 12:
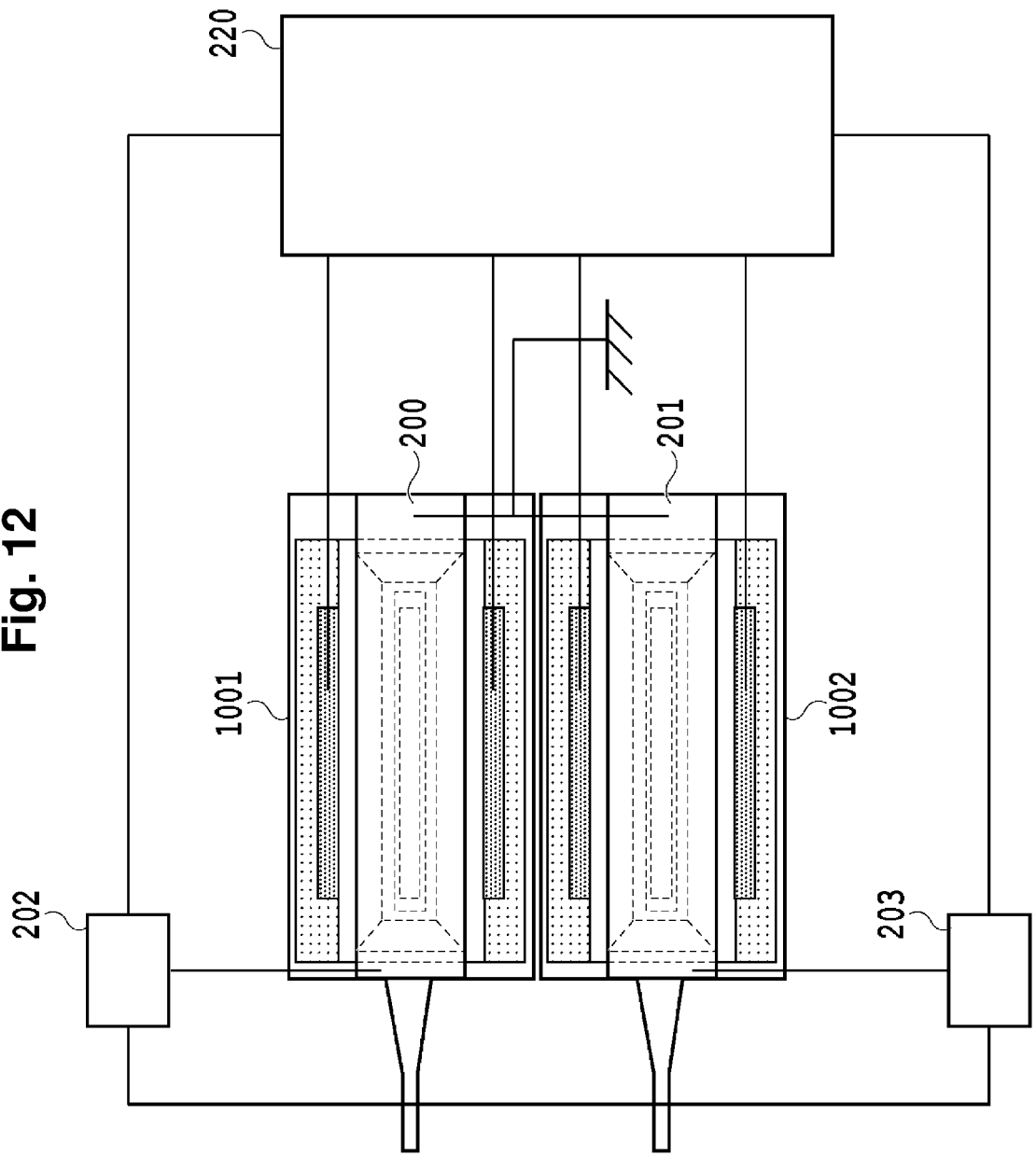
FIG. 12 is a diagram showing a configuration of a photodetector according to a third embodiment.

FIG. 12 is a diagram showing a configuration of a third embodiment of the photodetector according to the present invention. In this example, a transimpedance amplifier 220 connected to the anodes of the Ge PDs 1001 and 1002 serve as a monitor while the heaters 200 and 201 containing a metal or metal compound are placed as resistors. The Ge PDs 1001 and 1002 are placed as a PD pair to receive a differential signal. The transimpedance amplifier 220 amplifies Ge PD signals and produces voltage output while monitoring currents from the Ge PDs. The transimpedance amplifier 220 feeds values of the currents back to the voltage sources 202 and 203, which then control the heaters such that currents entering the transimpedance amplifier 220 from the Ge PDs will be equal to each other. Whereas the heaters made of a metal or metal compound are used as resistors in FIG. 12, heaters created by implantation (ion implantation) in the core layers 110 of the Ge PDs 1001 and 1002 may be used as shown in the second embodiment. Also, whereas the anodes of the Ge PDs 1001 and 1002 are connected to the transimpedance amplifier 220 in FIG. 12, the cathodes may be connected to the transimpedance amplifier 220.

Embodiment 4

Figure 13:
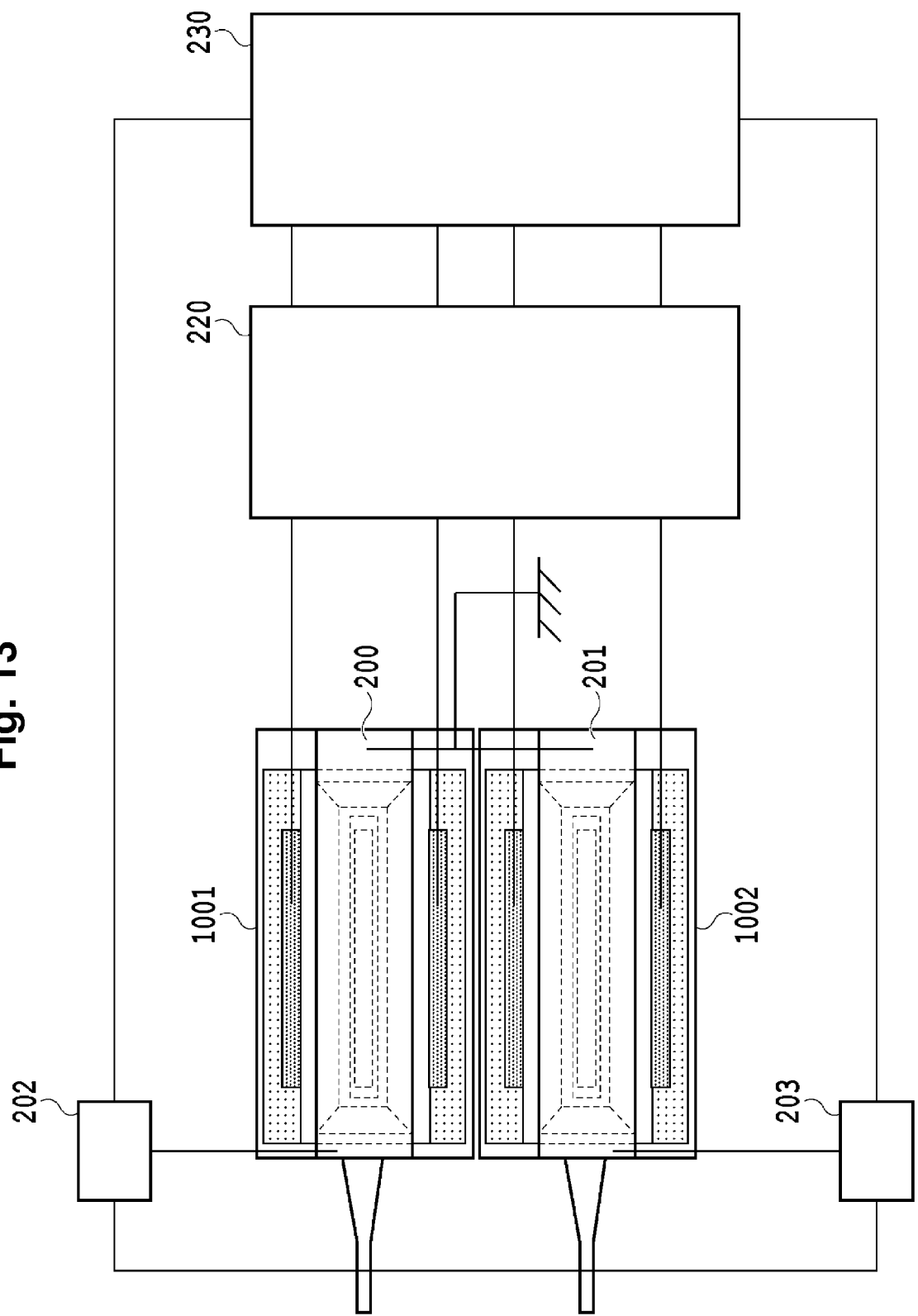
FIG. 13 is a diagram showing a configuration of a photodetector according to a fourth embodiment.

FIG. 13 is a diagram showing a configuration of a fourth embodiment of the photodetector according to the present invention. In this example, a digital signal processor 230 connected to a succeeding stage of the transimpedance amplifier 220 connected to the anodes of the Ge PDs 1001 and 1002 serves as a monitor, and the heaters 200 and 201 made of a metal or metal compound are placed as resistors. The Ge PDs 1001 and 1002 are placed as a PD pair to receive a differential signal. The digital signal processor 230 monitors signals input from the Ge PDs through the transimpedance amplifier 220 and feeds values of the currents back to the voltage sources 202 and 203, which then control the heaters such that currents entering the transimpedance amplifier 220 from the Ge PDs will be equal to each other. Whereas the heaters made of a metal or metal compound are used as resistors in FIG. 13, the heaters created by implantation in the core layers 110 of the Ge PDs 1001 and 1002 and shown in the second embodiment may be used. Also, whereas the anodes of the Ge PDs 1001 and 1002 are connected to the transimpedance amplifier 220 in FIG. 12, the cathodes may be connected to the transimpedance amplifier 220.

INDUSTRIAL APPLICABILITY

The present invention is applicable to photodetectors used in optical communications systems and optical information processing systems.

REFERENCE SIGNS LIST 200, 201 Heater
202, 203 Power supply (voltage source)
204 Ammeter
212 Output port
1001, 1002 GePD

The invention claimed is:

1. A photodetector comprising:
two or more photodiodes placed to receive an input differential signal;
a current monitor adapted to measure photocurrents of the two or more photodiodes;
resistors adapted to heat the photodiodes; and
voltage sources connected to the respective resistors to control the resistors and capable of controlling voltage values independently of each other, wherein
the voltage sources are connected with the current monitor, and the voltage sources manipulate voltages applied to the resistors such that values of currents output by the two or more photodiodes, as measured by the current monitor, match each other.

2. The photodetector according to claim 1, wherein each of the photodiodes includes:
a silicon substrate;
a lower clad layer on the silicon substrate;
a silicon core layer located on the lower clad layer and including a silicon region doped with first conductive impurity ions;
a germanium layer located on the silicon core layer and including a germanium region doped with second conductive impurities;
an upper clad layer located on the silicon core layer and the germanium layer; and
electrodes respectively connected to the silicon region and the germanium region.

3. The photodetector according to claim 1, wherein each of the photodiodes includes:
a silicon substrate;
a lower clad layer on the silicon substrate;
a silicon core layer on the lower clad layer;
a germanium layer located on the silicon core layer and including a germanium region doped with first conductive impurities and a germanium region doped with second conductive impurities;
an upper clad layer on the silicon core layer and the germanium layer; and
electrodes respectively connected to the germanium region doped with the first conductive impurities and the germanium region doped with the second conductive impurities.

4. The photodetector according to claim 1, wherein each of the photodiodes includes:
a silicon substrate;
a lower clad layer formed on the silicon substrate;
a silicon core layer formed on the lower clad layer and including a silicon region doped with first conductive impurity ions and a silicon region doped with second conductive impurity ions;
a germanium layer formed on the silicon core layer;
an upper clad layer formed on the silicon core layer and the germanium layer; and
electrodes connected to the respective silicon regions.

5. The photodetector according to claim 2, wherein each resistor is embedded in the upper clad layer so as to cover the germanium layer, and contains a metal or a metal compound.

6. The photodetector according to claim 2, wherein each resistor contains impurity ions in the silicon core layer by surrounding the germanium layer.

7. The photodetector according to claim 1, wherein the current monitor is an ammeter connected to an anode or a cathode of each of the photodiodes.

8. The photodetector according to claim 1, wherein the current monitor is a transimpedance amplifier or a digital signal processor connected to an anode or a cathode of each of the photodiodes.

9. The photodetector according to claim 2, wherein each resistor is embedded in the upper clad layer so as to cover the germanium layer, and contains a metal or a metal compound.

10. The photodetector according to claim 3, wherein each resistor is embedded in the upper clad layer so as to cover the germanium layer, and contains a metal or a metal compound.

11. The photodetector according to claim 4, wherein each resistor is embedded in the upper clad layer so as to cover the germanium layer, and contains a metal or a metal compound.

12. The photodetector according to claim 2, wherein each resistor contains impurity ions in the silicon core layer by surrounding the germanium layer.

13. The photodetector according to claim 3, wherein each resistor contains impurity ions in the silicon core layer by surrounding the germanium layer.

14. The photodetector according to claim 4, wherein each resistor contains impurity ions in the silicon core layer by surrounding the germanium layer.

* * * * *